US006822373B1

(12) United States Patent

Butler

(10) Patent No.: US 6,822,373 B1

(45) Date of Patent: Nov. 23, 2004

(54) BROADBAND TRIPLE RESONANT TRANSDUCER

(75) Inventor: Stephen C. Butler, Newport, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 47 days.

(21) Appl. No.: 10/308,983

(22) Filed: Nov. 25, 2002

(51) Int. Cl.[7] .......................... H01L 41/08; H01L 41/04

(52) U.S. Cl. ........................ 310/325; 310/328; 310/329

(58) Field of Search ................................ 310/325, 328, 310/329

(56) References Cited

U.S. PATENT DOCUMENTS 3,230,403 A * 1/1966 Lewis et al. ................ 310/334
4,427,912 A * 1/1984 Bui et al. ................... 310/322
5,051,647 A * 9/1991 Uchikawa et al. ..... 310/323.12
5,115,161 A * 5/1992 Myohga et al. ........ 310/323.15
5,249,163 A * 9/1993 Erickson ..................... 367/149
5,456,259 A * 10/1995 Barlow et al. .............. 600/459
5,998,908 A * 12/1999 Goodson .................... 310/325
5,998,910 A * 12/1999 Park et al. .................. 310/358
6,236,144 B1 * 5/2001 Millar et al. ................ 310/334

FOREIGN PATENT DOCUMENTS

JP 2002066457 A * 3/2002 .......... H02N/02/00

* cited by examiner

*Primary Examiner*—Thomas M. Dougherty
*Assistant Examiner*—J. Aguirrechea
(74) *Attorney, Agent, or Firm*—James M. Kasischke; Michael F. Oglo; Jean-Paul A. Nasser

(57) ABSTRACT

The present invention relates to a broadband transducer which comprises a tail mass located at a first end of the transducer, an active compliant driver section positioned adjacent the tail mass, a first center mass positioned adjacent an end of the active compliant driver section, a first passive compliant member positioned adjacent the first center mass, and a head mass located generally adjacent a second end of the transducer, which second end is opposed to the first end. In one embodiment, the head mass is proximate the second end and another center mass and a second passive compliant members are interposed between the first center mass and the head mass. In another embodiment, a quarter-wave matching layer which forms another mass component and a second passive compliant member component, is interposed between the head mass and the second end.

13 Claims, 7 Drawing Sheets

BROADBAND TRIPLE RESONANT TRANSDUCER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to a wideband electroacoustic sonar transducer.

(2) Description of the Prior Art

Various design approaches have been used to create broadband sonar transducers that can transmit complex sonar signals. One such approach is exemplified by the longitudinal vibrator tonpilz type double resonant sonar transducer known as the Rodrigo type design. For example, G. C. Rodrigo; "Analysis and Design of Piezoelectric Sonar Transducers," Department of Electrical and Electronic Engineering Queen Mary College, London, UK, Phd Thesis August 1970 and also commonly referred to as a "double head mass" transducer, for example, A. G. Elliott, "The design of a high power broadband noise source"; Proceedings of the Institute of Acoustics Vol. 12 Part. 4 1990 Sonar Tranducers for the Nineties, pp 126–135, Birmingham, UK, December 1990.

U.S. Pat. No. 4,633,119 to Thompson illustrates a broadband longitudinal vibrator transducer having a laminar head mass section including at least three layers coupled to electromechanical transducer elements. The head section, includes a forward head mass, a compliant member abutting the forward head mass and a rear head mass abutting both the compliant member and the transducer elements. The compliant member allows the head mass section to mechanically resonate in at least two frequencies expanding the bandwidth of the transducer. The compliant member can be an active transducer element.

U.S. Pat. No. 5,047,683 to Butler et al. illustrates a hybrid transducer having mass and compliance loading for permitting operation at a lower frequency. The mass loading may include the use of one or more pistons to couple the energy to the medium.

Despite the existence of these transducers, there remains a need for broadband sonar transducers that can transmit complex sonar signals.

SUMMARY OF THE INVENTION

Accordingly, it is an object of the present invention to provide a transducer having an increased lower frequency transmit bandwidth, over traditional longitudinal vibrating type underwater transducers.

It is a further object of the present invention to provide a triple resonant transducer.

The foregoing objects are attained by the broadband transducer of the present invention.

In accordance with the present invention, a broadband transducer broadly comprises a tail mass located at a first end of the transducer, an active compliant driver section positioned adjacent the tail mass, a first center mass positioned adjacent an end of the active compliant driver section, a first passive compliant member positioned adjacent the first center mass, and a head mass located adjacent a second end of the transducer. The second end of the transducer being opposed to the first end of the transducer. In one embodiment, a second center mass and a second passive compliant member are interposed between the first passive compliant member and the head mass. In a second embodiment, a quarter-wave matching layer which forms another mass component and a second passive compliant member component, is added to the top of the head mass and is now in contact with the medium and which now becomes the second end.

Other details of the broadband triple resonant transducer of the present invention, as well as other objects and advantages attendant thereto, are set forth in the following detailed description and the accompanying drawings wherein like reference numerals depict like elements.

DESCRIPTION OF THE PREFERRED EMBODIMENT(S)

Figure 3:
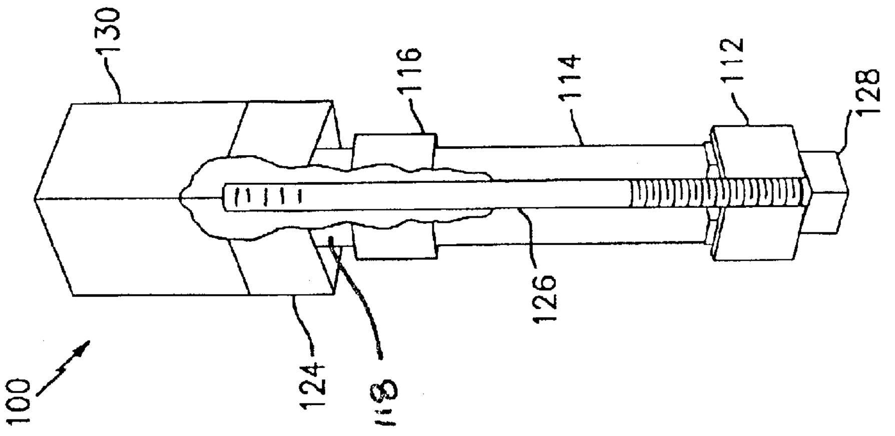
FIG. 3 is a like schematic representation of a second embodiment of a triple resonant transducer in accordance with the present invention.
Figure 1:
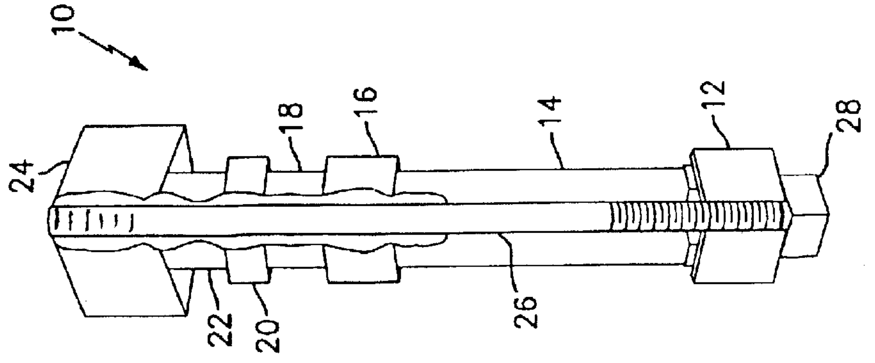
FIG. 1 is a mechanical schematic representation of a first embodiment of a triple resonant transducer in accordance with the present invention, in which regions have been cut away to display tie rod 26.
Figure 2:
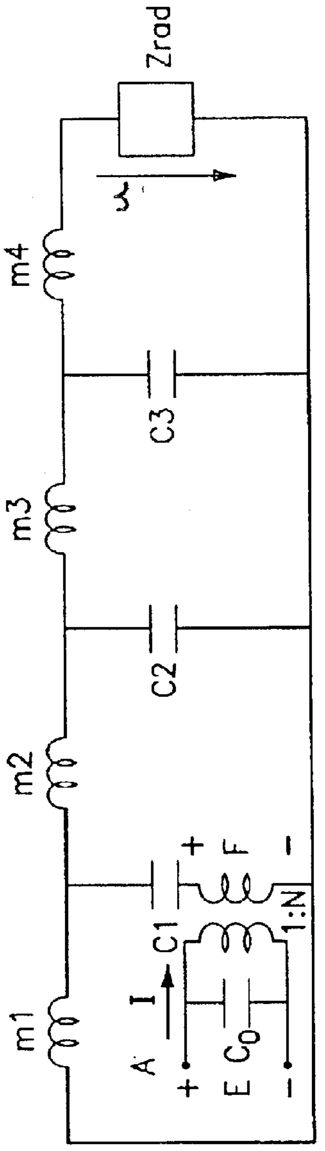
FIG. 2 is a simplified lumped equivalent circuit representation of the transducer of FIG. 1.
Figure 4:
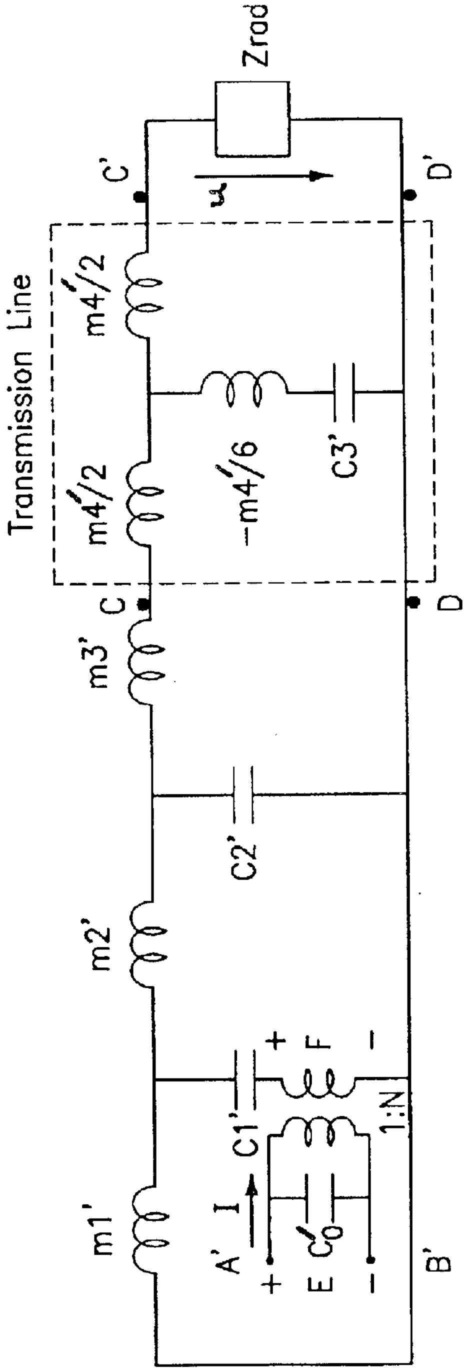
FIG. 4 is a simplified lumped equivalent circuit representation of the triple resonant transducer of FIG. 3.

In the description following in this specification, the components of the embodiment of FIGS. 1 and 2 and of the embodiment of FIGS. 3 and 4 are sometimes both identified by numerical reference characters relating to the mechanical schematics of FIGS. 1 and 3 and by alpha-numeric reference characters relating to the electrical equivalent circuits of FIGS. 2 and 4. Referring now to the drawings, FIGS. 1 and 2 illustrate a first embodiment of a broadband transducer 10 in accordance with the present invention. The transducer 10 comprises a triple resonant transducer design and is a mechanical series arrangement of a tail mass 12, m1, an active compliant driver section 14, C1, positioned adjacent the tail mass 12, a first center mass 16, m2, positioned adjacent the active driver section 14, a first passive compliant member 18, C2, positioned adjacent the first center mass 16, a second center mass 20, m3, positioned adjacent the first passive compliant member 18, a second passive compliant member 22, C3, positioned adjacent the second center mass 20, a head mass 24, m4, and a stress rod or tie bolt 26 and nut 28. The tail mass 12 is located at a first end of the transducer 10 and the head mass is located at a second end of the transducer 10 opposed to the first end. The masses 12, 16, 20, and 24 may be formed from any suitable material such as metals. For example, the center masses 16 and 20 and the tail mass 12 may be formed from brass, steel, or tungsten metals, while the head mass 24 may be formed from aluminum, aluminum alloys, magnesium, magnesium alloys, or alumina. Typically, the tail mass 12 is heavier than the head mass 24 so that the head mass 24 can vibrate or move at greater velocities to radiate acoustic energy in that direction. The active compliant driver section 14 is preferably formed by a number of piezoelectric ceramic rings in a stack arrangement. Any number of rings may be used to form the stack, such as from 8 to 12 rings. The compliant members 18 and 22 may also be formed from any suitable material known in the art such as a Fiberglass material known as G-10, an acrylic resin material such as LUCITE, and rubber materials which are more springier than harder materials such as metals. Compliance is the inverse of stiffness and is the ratio of the thickness of the material to the Young's modulus times the cross-sectional surface area of the material. The stress rod or tie bolt 26 and nut 28 are used to consolidate the components together and provide a compressive bias stress to the active compliant driver stack 14. The stress rod and nut may be formed from any suitable metal.

This transducer design creates a triple-resonant (mass-spring-mass-spring-mass-spring-mass system) transducer in which the inactive passive compliances 18 and 22 control the upper resonances and the active compliant driver section 14 controls the lower resonance. The active compliant driver section 14 acts as the active driver of the transducer 10. Optimum bandwidth may be achieved with this design when; (i) the center mass 16 and the tail mass 12 are equal in mass; (ii) the mass 20 and the head mass 24 are equal in mass and half the weight of the tail mass 12; (iii) and the active compliant driver section 14 and the passive compliances 18 and 22 have equal compliance values. The transducer operation can be described by a mechanical representation, or by an equivalent analog electrical lumped circuit representation, such as that shown in FIG. 2 of four masses, three compliances, and an electromechanical transformer with turns ratio, N, which converts electrical voltage and current to a mechanical force and velocity. Co is the blocking capacitance.

The triple resonant transducer design shown in FIG. 1 generates three coupled resonances at f1, f2, and f3. As one illustration of such coupled resonances, they may be resonances at the monotonically increasing frequencies of 15, 25 and 37.5 kHz. The f1 resonance may be generated by the active compliant driver section 14 resonating with the tail mass 12 and the two center masses 16 and 20, two G-10 fiberglass compliances 18 and 22, and head mass 24 all acting together as one lumped mass. The f3 resonance may be generated by the second center mass 20 and a G-10 compliance 22 resonating with the head mass 24. The f2 resonance may be generated as a condition of resonance between; (i) the first center mass 16 and G-10 compliance 18; and (ii) the second center mass 20, G-10 compliance 22, and head mass 24, all functioning together as one lumped mass.

Referring now to FIGS. 3 and 4, a second triple resonant broadband transducer design 100 is illustrated. The transducer 100 is also a mechanical series arrangement of a tail mass 112, m1', at a first end, an active compliant driver section 114, C1', positioned adjacent the tail mass 112, a center mass 116, m2', positioned adjacent the active driver section 114, a first passive compliance 118, C2', positioned adjacent the center mass 116, a head mass 124, m3', positioned adjacent the first passive compliance 118, and a quarter-wave matching layer 130 positioned at a second end of the transducer, which second end is opposed to the first end. The quarter-wave matching layer 130 has a mass component, m4', (shown by its equivalent values in FIG. 4) and a passive compliance component C3' that resonate with each other when the layer is a quarter wave-length long and may be calculated by Equation 1 or 2 below:

$$f = \frac{1}{2\pi}\sqrt{\frac{3}{C3' \cdot m4'}} \quad (1)$$

$$f = \frac{c_m}{4l} \quad (2)$$

where $c_m$ and l are the planewave sound speed and thickness of the quarter-wave matching layer, Equation 1 and Equation 2 assumes the matching layer is fixed on one-side and free on the other.

Figure 6:
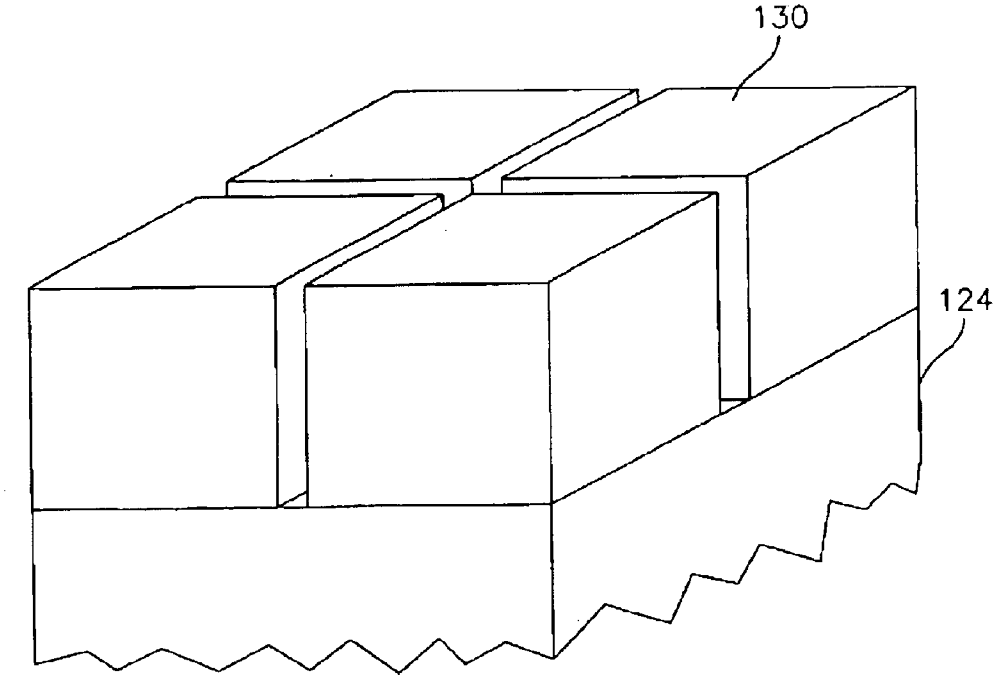
FIG. 6 illustrates a diced quarter-wave matching layer preferably used in the embodiment of FIG. 3.

The quarter-wave matching layer 130 is preferably diced as shown in FIG. 6 forming longitudinal clefts which split the matching layer 130 into quarter subsections to remove unwanted lateral frequency modes. The active compliant driver section 114 may be formed by a piezoelectric ceramic stack which serves as the active driver of the transducer 100. The materials forming the tail mass 112, the center mass 116, and the head mass 124 may be those discussed hereinbefore. Similarly, the material which forms the first passive compliance 118 may be the same as those discussed above. Stress rod or tie bolt 126 and nut 128 are used in transducer 100 to consolidate the components together and provide a compressive bias stress to the active compliant driver stack 114.

This design also creates a triple resonant transducer in which the inactive compliance 118 section controls the upper resonance, f3, the active compliant driver section 114 controls the lower resonance, f1, and the quarter matching layer 130 controls the center frequency, f2, of monotonically increasing series of frequencies f1, f2 and f3. Optimum bandwidth may be achieved in this design when: (i) the center mass 116 and the tail mass 112 are equal in mass, (ii) head mass 124 and matching layer mass component 130 are each one-half the weight of the tail mass 112, (iii) compliance 118 has one-half the compliance of active compliance 114, and (iv) the quarter-wave matching layer compliance component is twice that of compliance 114. This transducer design can be described by a simplified equivalent electrical lumped circuit representation shown in FIG. 4 of four masses, three compliances, a lumped transmission line "T" network describing the quarter-wave matching layer, and an electro-mechanical transformer with turns ratio of N and blocking capacitance Co'.

The equivalent circuit transmission line "T" network that 4 describes the quarter-wave matching layer in FIG. 4 is a 2-ported network comprising of three branches that are in a form of a "T". The input branch terminals C–D is represented by a series mass and the output branch terminals C'–D' is represented by a series mass, both having values that are equivalent to one-half the weight or mass m4' (shown by its equivalent values in FIG. 4) of the quarter-wave matching layer block, or (m4'/2). The center branch is a series combination of a mass and a compliance tied between the equivalent input mass (m4'/2) and equivalent output mass (m4'/2) and tied to the common terminals D–D'. The equivalent mass value in this branch is a negative one-sixth the weight or mass m4' of the quarter-wave matching layer block, or (−m4'/6) and C3' is the compliance of wave matching layer block, as detailed in J. L. Butler course notes 18 "Underwater sound transducers", Image Acoustics, Inc. Cohasset, Mass., 1982, pp. 217 and pp. 231.

Figure 5:
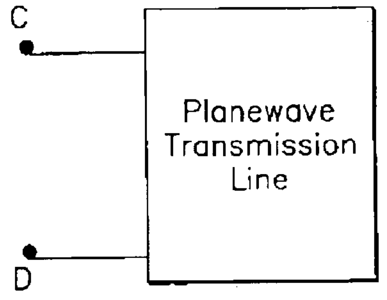
FIG. 5 is the planewave transmission line equivalent circuit representation of the quarter-wave matching layer used to replace the lumped transmission line network in FIG. 4.

The lumped transmission line "T" network in FIG. 4 may be replaced by the planewave transmission line network in FIG. 5, which provides a precise calculation of the wave propagation 23 within the quarter-wave matching layer as seen in L. E. Kinsler, A. R. Frey, A. B. Coppens and J. V. Sanders, "Fundamentals of Acoustics", 3rd edition, Wiley and Sons, New York, 1982, pp. 201 and is given by Equation 3 below:

$$Z_{C-D} = Z_m\left[\frac{Z_{rad} + jZ_m\tan(kl)}{Z_m + jZ_{rad}\tan(kl)}\right] \quad (3)$$

where, $Z_{C-D}$ is the input impedance seen at terminals C–D, which includes the matching layer impedance and radiation impedance load.

$Z_m=\rho_m c_m A_m$ (matching layer impedance)

$k=\omega/c_m$ known as the wave number $\omega=2\pi f$, f is frequency in Hz $c_m$=sound speed of matching layer l=thickness of matching layer $\rho_m$=density of matching layer $A_m$=surface area of matching layer $Z_{rad}$=radiation impedance load The triple resonant transducer 100 uses a quarter-wave matching layer 130 which preferably has an acrylic resin material such as LUCITE on its radiating face. The transducer 100 generates three coupled resonances at f1, f2, and f3. The f1 resonance may be generated by the active compliant driver section 114 resonating with the tail mass 112 and the center mass 116, G-10 compliance 118, head mass 124 and the LUCITE quarter-wave matching layer 130, all functioning together as one lumped mass. The f3 resonance may be generated by the center mass 116 and G-10 compliance 118 resonating with the head mass 124 and the LUCITE quarter-wave matching layer 130 acting as one lumped mass. Although the active compliant driver section 114 is essentially decoupled from the transducer, it still acts as a driving force for this mode. The f2 resonance may be generated by the LUCITE quarter-wave matching layer 130, providing the proper impedance transformation. LUCITE is preferred as the matching layer because its characteristic impedance (density time sound speed) is close to that of water's characteristic impedance and its mechanical loss factor is well known.

Figure 7:
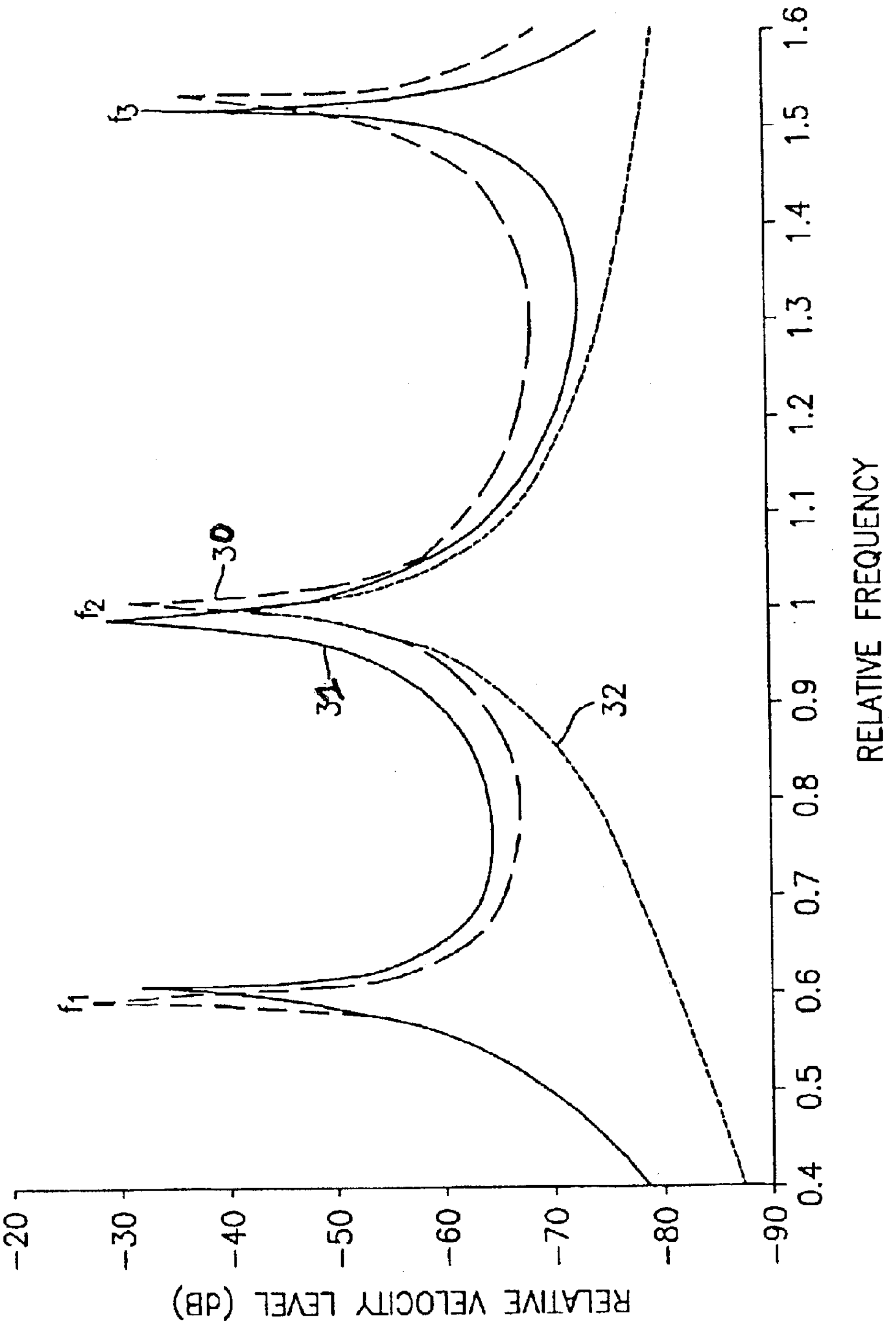
FIG. 7 illustrates the in-air velocity response curves of the simplified lumped equivalent circuit of FIGS. 2 and 4 and of a traditional transducer of same size and weight.

Applying a constant voltage "E" to terminals A and B and A' and B' of the equivalent circuits of FIGS. 2 and 4, respectively, the relative piston velocity "u" through the radiation impedance load Zrad was calculated using standard electrical engineering circuit analysis techniques. The radiation impedance load Zrad is a complex quantity containing a real part Rrad and a reactive part Xrad. Analysis was performed to simulate three different radiation loading conditions. The in-air loading case Zrad is a short circuit, and the in-water case Zrad is equal to radiation impedance function of a piston in an infinite rigid baffle, for example see L. E. Kinsler and A. R. Frey, Fundamentals of Acoustics, 2ed., Wiley & Sons, New York, 1962, pp 179. The third case is a transducer operating under an ideal array loading, when Zrad is equal to the radiating piston surface area $A_p$ of the transducer times the density $\rho_w$ and sound speed $c_w$ of water. The piston surface is approximately a half-wavelength in size at 1.2 normalized frequency units. FIG. 7 illustrates the in-air velocity response curves of both equivalent circuits when a constant voltage E of one (1.0) is applied to terminals A and B or to A' and B'. Curve 30 for transducer 10 and curve 31 for transducer 100 illustrate the three coupled resonances f1, f2 and f3 developed by these designs, where f1 is 0.6 times f2 and f3 is 1.5 times f2 on the normalized frequency scale. The curves are compared to single resonant traditional longitudinal vibrating transducer of the same size and weight shown in curve 32. The in-water cases of radiation impedance loading of a piston in an infinite baffle and ideal array loading are displayed as transmitting voltage responses TVR rather than velocity response, which is a common practice. The TVR is the acoustic pressure generated by the transducers piston at one-meter distance for one-volt drive input referenced to 1 μpa. The TVR is related to the velocity "u" by equation 4 below:

$$TVR = 20\cdot\text{Log}\left(\frac{f*\rho_w*u*A_p}{E*1\times10^{-6}}\right) \quad (4)$$

Figure 8:
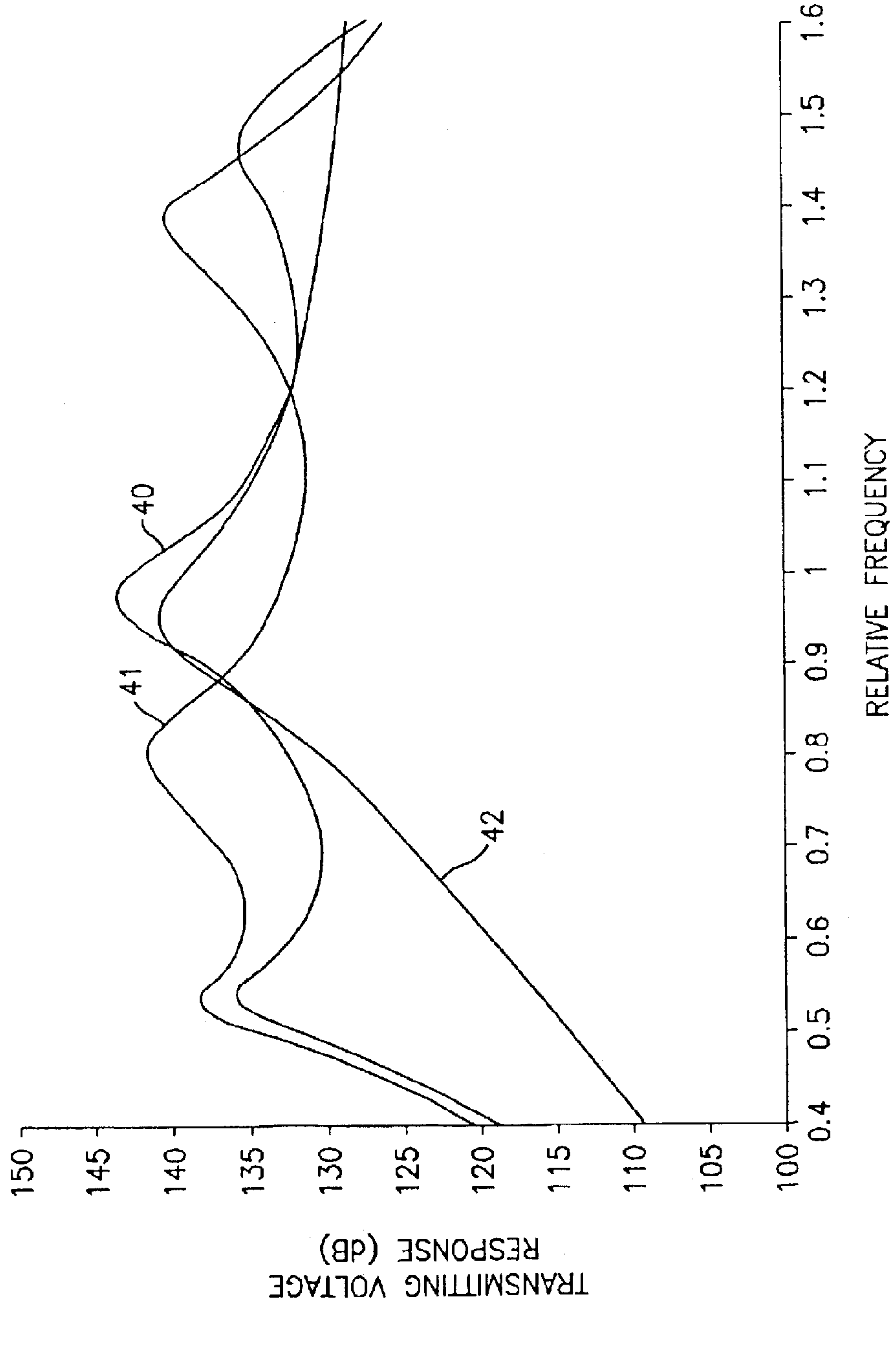
FIG. 8 illustrates the in-water transmitting voltage response curves of the equivalent circuits of FIGS. 2 and 4 and a traditional transducer with pistons in rigid baffle loading.
Figure 9:
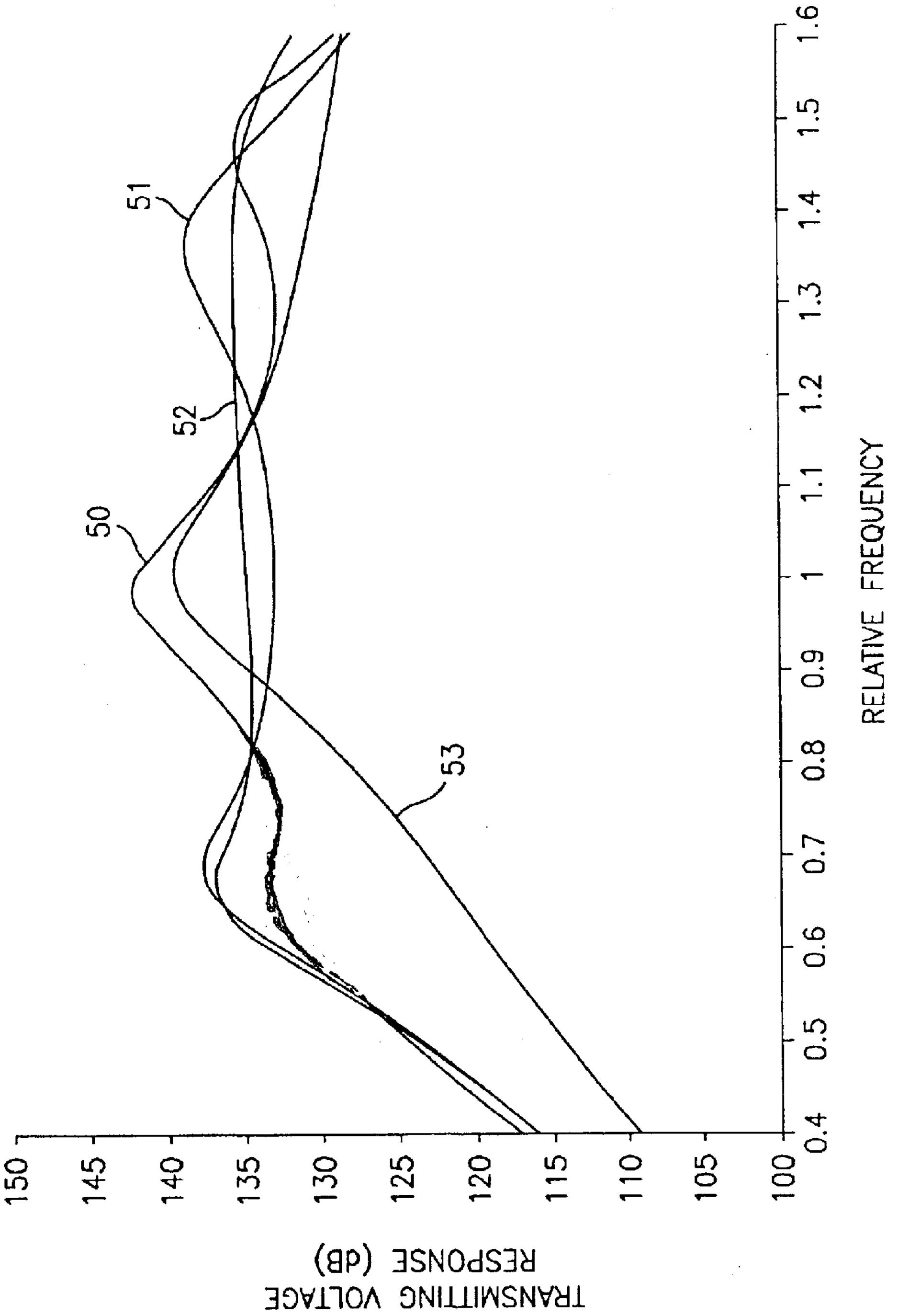
FIG. 9 illustrates the in-water transmitting voltage response curves of equivalent circuits of FIGS. 2 and 4 (with lumped and plane wave transmission circuits for the quarter-wave matching layer) and a traditional transducer of same size and weight for the case ideally array loaded pistons.

FIG. 8 illustrates the in-water transmitting voltage response for the case of radiation impedance loading of a piston in an infinite baffle, curve 40 is that of transducer 10, curve 41 is that of transducer 100 and curve 42 is that of a traditional transducer of the same size and weight. Note the improved increase in response level at low frequency (less than 1.0 frequency unit) of the triple resonant transducers 10 and 100 over the traditional transducer. For the traditional transducer to resonate at the normalized frequency of 0.5 it would have to double in length, since length is inversely proportional to frequency. Sonar transducers of this type "longitudinal vibrators" are intended to be used within a closely packed array of identical transducer elements that range in numbers of 16 to 200 elements for example or greater than a two-wavelength by two-wavelength size array. Under this condition the radiation impedance is that of a transducer operation under an ideal array loading (Zrad= $\rho_w \cdot c_w \cdot A_p$). This off-course is a very simplistic view of array loading concept, which does not include piston mutual interaction and element spacing. FIG. 9 illustrates the in-water transmitting voltage response for the case of ideally array loaded pistons wherein curve 50 is that of transducer 10, curve 51 is that of transducer 100 using the lumped transmission line representation of the quarter-wave matching layer in FIG. 4, curve 52 is that of transducer 100 using the planewave transmission line representation of the quarter-wave matching layer in FIG. 5, and curve 53 is that of a traditional transducer of the same size and weight. The increase in low frequency bandwidth for the triple resonant transducers is apparent when compared to the traditional transducer. The typical definition of operating bandwidth of a sonar transducer is when the transmitting response falls below 3 dB of the peak response level above and below its resonance, thus for the traditional transducer curve 53 the relative frequency bandwidth is from 0.93 to 1.10 frequency units or total width of 0.17. In the traditional sense, transducer 10 curve 50 bandwidth is a total width of 0.19, or 0.91 to 1.1 frequency units, but has an extended low frequency transmit capable over the traditional transducer producing 15 dB more transmit level at 0.6 frequency units. Transducer 100 with lumped transmission line representation of the quarter-wave matching layer in FIG. 4 is illustrated in curve 51. Curve 51 illustrates the wideband nature of the transmit response, but the response dips more than 3 dB in the center of the response band, which does not enable calculation of the bandwidth. Curve 52 illustrates transducer 100 transmit response using a planewave transmission line representation of FIG. 5. The relative frequency bandwidth is from 0.58 to 1.58 frequency units. This is a total bandwidth of 1.0 frequency units, or a 100% bandwidth when referenced to the normalized frequency unit of one.

Figure 10:
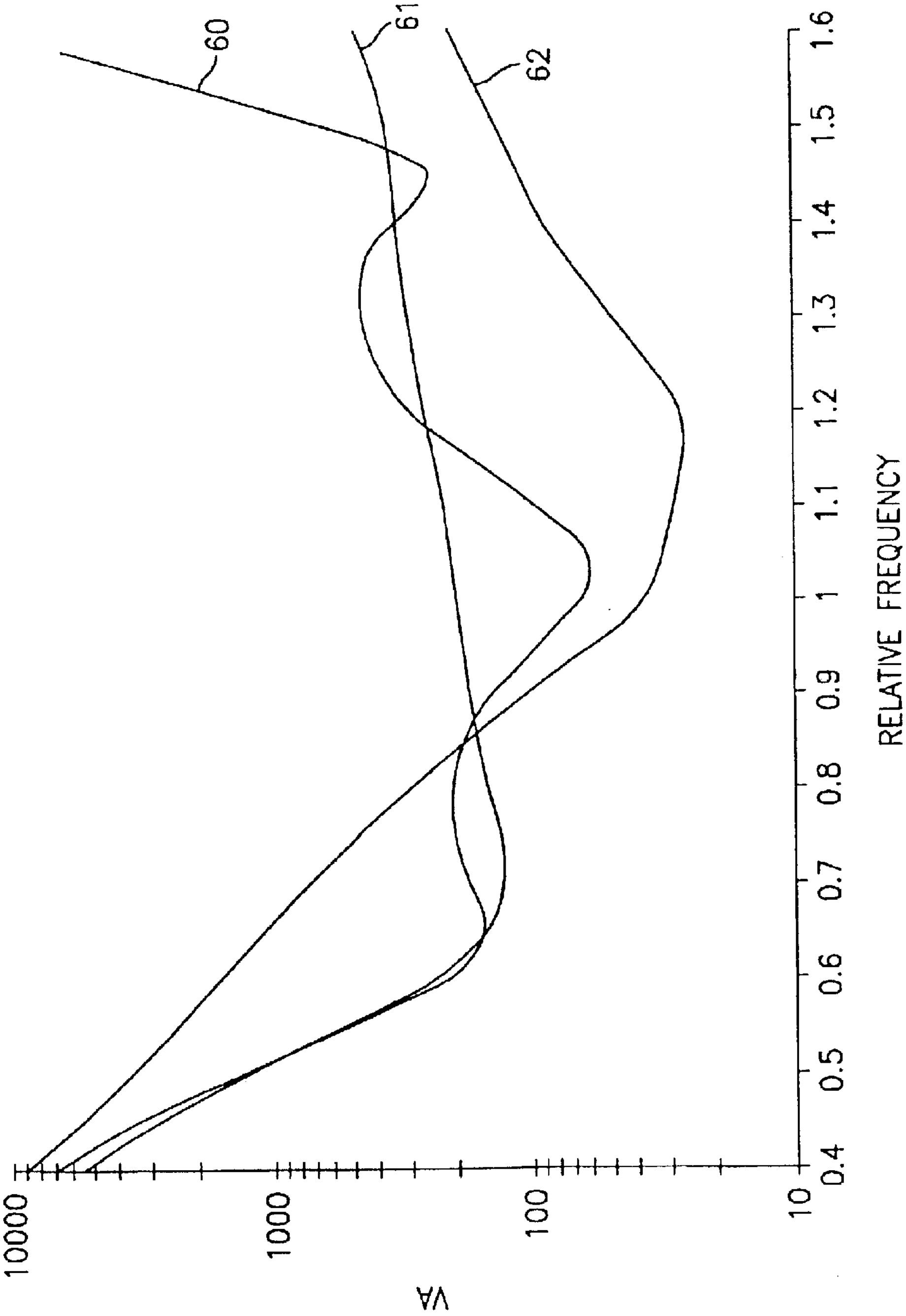
FIG. 10 illustrates volt-amp response of the triple resonant transducer and traditional transducer when the sound pressure level is maintained constant over the frequency band.

Referring to FIG. 10, there is also a 7 to 8 times improvement in electrical voltage and current supplied to drive transducers at 0.6 frequency as shown in curve 60 for transducer 10 and curve 61 for transducer 100, when compared with the traditional transducer curve 62, for the case of the transducers transmitting a constant or same acoustic pressure from 0.4 to 1.6 frequency units. The transducers were not electrical tuned. As an example the traditional transducer would need a power amplifier that was capable of supplying 1500 Volt-Amps to transmit a constant sound pressure level over the frequency band of 0.6 to 1.5. The triple resonant transducer would only need a 400 VA power amplifier to transmit the same constant sound pressure level over the frequency band of 0.6 to 1.5.

The transducer designs of the present invention produce greater bandwidths than current technology designs and/or traditional Tonpilz transducer designs. The increase in operating bandwidth is achieved without using exotic expensive transduction materials. This makes the transducer designs of the present invention a cost effective broadband transducer. The transducer designs of the present invention have lower frequency capabilities from small package (element size), than current traditional Tonpilz transducers of the same size and weight.

If desired, additional masses and compliances can be added to make a four resonant peak transducer, five resonant peak transducer, six resonant peak transducer, and the like.

While it is preferred to use LUCITE for the quarter-wave matching layer 130, other materials such as Fiberglass, plastics, LEXAN, and the like may be used instead.

If desired, the piezoelectric ceramic sections 14 and 114 may be replaced by a magnetostrictive material which serves as the active driver of the transducers. The magnetostrictive material may be nickel or Terfenol-D.

While the components forming the transducer designs 10 and 100 have been described as being separate components, they can also be a solid element that can be described by a mass-spring system such as a quarter wave-matching layer resonator.

It is apparent that there has been provided in accordance with the present invention a broadband triple resonant transducer which fully satisfies the objects, means, and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations which fall within the broad scope of the appended claims.

What is claimed is:

1. A broadband transducer which generates longitudinal vibrations including at least three resonances at monotonically increasing frequencies f1, f2, and f3, comprising:

a first mass forming a tail mass located at a first end of the transducer;

an active compliant driver section positioned adjacent said tail mass;

a second mass forming a first center mass positioned adjacent an end of said active compliant driver section;

a first passive compliant member positioned adjacent said first center mass;

a third mass forming a second center mass positioned adjacent said first passive compliant member;

a second passive compliant member positioned adjacent said second center mass;

a fourth mass forming a head mass located adjacent a second end of said transducer, said second end being opposed to said first end;

wherein as a component of the transducer's longitudinal output vibrations along the axis between its ends there is caused to be produced the first frequency f1 of said series of frequencies by a first predetermined set of cooperations among the active compliant driver section, tail mass, first center mass, second center mass, first compliant member, second compliant member, and head mass, said first predetermined set of cooperations comprising the active compliant driver section and tail mass forming a driver section and mass entity, and the driver section and tail mass entity, first and second center masses, first and second compliant members, and head mass all functioning together as one entity to cause resonance at the first frequency f1;

wherein as another component of said longitudinal output vibrations there is further caused to be produced the second frequency f2 of said series of frequencies by a second predetermined set of cooperations among the first center mass, first passive compliant member, head mass, second center mass, and second passive compliant member, said predetermined second set of cooperations comprising the second center mass, second passive compliant member, and head mass all functioning as another lumped mass, and the first center mass, first passive compliant member, and said another lumped mass cooperating to generate said frequency f2; and wherein as still another component of said longitudinal output vibration there is further caused to be produced the third frequency f3 of said series of frequencies by a third predetermined set of cooperations among the second center mass, second passive compliant member, and head mass, said third set of cooperations comprising the second center mass and second passive compliant member functioning as a mass and compliant member entity, and said mass and compliant member entity and the head mass being matched to generate said resonance condition at said third frequency f3.

2. A broadband transducer according to claim 1 wherein the first center mass has a mass equal to the mass of the tail mass.

3. A broadband transducer according to claim 2 wherein the second center mass has a mass equal to the mass of said head mass.

4. A broadband transducer according to claim 3 wherein the second center mass and the head mass each have one-half the weight of the tail mass.

5. A broadband transducer according to claim 1 wherein the first passive compliant member, the second passive compliant member, and the active compliant driver section have equal compliance values.

6. A broadband transducer according to claim 1 wherein said active compliant driver section is formed from a magnetostrictive material.

7. A broadband transducer according to claim 1 wherein said active compliant driver section is formed from a piezoelectric ceramic stack.

8. A broadband transducer which generates longitudinal vibrations including at least three resonances at monotonically increasing frequencies f1, f2 and f3, comprising:

a first mass forming a tail mass located at a first end of the transducer;

an active compliant driver section positioned adjacent said tail mass;

a second mass forming a first center mass positioned adjacent an end of said active compliant driver section;

a first passive compliant member positioned adjacent said first center mass;

a third mass forming a head mass positioned adjacent said first passive compliant member;

a quarter-wave matching layer at the opposite end of the transducer forming a fourth mass component and a second passive compliant member component;

wherein as a component of the transducer's longitudinal output vibrations along the axis between its ends there is caused to be produced the first frequency f1 of said series of frequencies by a first predetermined set of cooperations among the first center mass, active compliance driver section, tail mass, first passive compliant member, head mass, and quarter-wave matching layer fourth mass, said first predetermined set cooperations comprising the active compliance driver section and tail mass forming a driver section and mass entity, and the first center mass, first passive compliant member, head mass, and quarter-wave matching layer fourth mass all functioning together as one lumped mass entity;

wherein as another component of said longitudinal output vibration there is further caused to be produced the third frequency f3 of said series of frequencies by a second predetermined set of cooperations among the first center mass, first Passive compliant member, head mass, and quarter-wave matching layer fourth mass, said second predetermined set of cooperations comprising the first center mass and first passive compliant member functioning as a mass and compliant member entity, said mass and compliant member entity resonating with the head mass and quarter-wave matching layer fourth mass acting as one lumped mass; and wherein as still another component of said longitudinal output vibration there is further caused to be produced the second frequency f2 of said series of frequencies by the inherent mass and compliance of the quarter-wave matching fourth mass.

9. A broadband transducer according to claim 8 wherein said quarter-wave matching layer is subdivided by a configuration of longitudinally extending clefts which remove undesired lateral frequency modes.

10. A broadband transducer according to claim 9 wherein said quarter-wave matching layer is formed from an acrylic resin material.

11. A broadband transducer according to claim 8 wherein said head mass and said quarter-wave matching layer fourth mass component are one-half the weight of the tail mass.

12. A broadband transducer according to claim 11 wherein said center mass has a mass equal to the mass of said tail mass.

13. A broadband transducer according to claim 11 wherein the first passive compliant member is one-half the compliance of the active compliant driver section and the quarter-wave matching layer compliance component has a compliance value twice the compliance value of the active compliant driver section.

* * * * *